(12) United States Patent
Aketa et al.

(10) Patent No.: US 9,425,373 B2
(45) Date of Patent: Aug. 23, 2016

(54) LIGHT EMITTING MODULE

(71) Applicant: PANASONIC INTELLECTUAL PROPERTY MANAGEMENT CO., LTD., Osaka (JP)

(72) Inventors: Takanori Aketa, Osaka (JP); Yoshiharu Sanagawa, Osaka (JP); Mitsuhiko Ueda, Osaka (JP); Takaaki Yoshihara, Osaka (JP); Shintaro Hayashi, Hyogo (JP); Toshihiko Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/774,207

(22) PCT Filed: Mar. 11, 2014

(86) PCT No.: PCT/JP2014/001366
§ 371 (c)(1),
(2) Date: Sep. 10, 2015

(87) PCT Pub. No.: WO2014/141691
PCT Pub. Date: Sep. 18, 2014

(65) Prior Publication Data
US 2016/0020374 A1    Jan. 21, 2016

(30) Foreign Application Priority Data

Mar. 15, 2013    (JP) .................................. 2013-053970

(51) Int. Cl.
*H01L 33/64*    (2010.01)
*H01L 33/62*    (2010.01)
*H01L 23/00*    (2006.01)
(Continued)

(52) U.S. Cl.
CPC .............. *H01L 33/647* (2013.01); *H01L 24/32* (2013.01); *H01L 27/156* (2013.01); *H01L 33/387* (2013.01); *H01L 33/40* (2013.01); *H01L 33/54* (2013.01); *H01L 33/56* (2013.01); *H01L 33/60* (2013.01); *H01L 33/62* (2013.01); *H01L 33/641* (2013.01); *H01L 33/642* (2013.01); *H01L 33/64* (2013.01); *H01L 2224/48091* (2013.01);
(Continued)

(58) Field of Classification Search
None
See application file for complete search history.

(56) References Cited

U.S. PATENT DOCUMENTS

| 6,876,008 | B2 | 4/2005 | Bhat et al. |
| 8,114,698 | B2 | 2/2012 | Zhong et al. |

(Continued)

FOREIGN PATENT DOCUMENTS

| JP | 2005-229021 | 8/2005 |
| JP | 2007-243076 | 9/2007 |

(Continued)

OTHER PUBLICATIONS

Office Action issued in European Patent Office (EPO) family member Patent Appl. No. 14765566.6, dated Apr. 18, 2016.

*Primary Examiner* — Scott B Geyer
(74) *Attorney, Agent, or Firm* — Greenblum & Bernstein, P.L.C.

(57) ABSTRACT

A light emitting module includes: a first substrate including a resin having insulation properties, and a copper component embedded in the resin; a second substrate placed above the copper component of the first substrate, and soldered to the copper component; a mounting electrode formed above the second substrate; and an LED placed above the second substrate, and gold-tin soldered to the mounting electrode.

12 Claims, 5 Drawing Sheets

(51) Int. Cl.
- *H01L 27/15* (2006.01)
- *H01L 33/38* (2010.01)
- *H01L 33/40* (2010.01)
- *H01L 33/54* (2010.01)
- *H01L 33/56* (2010.01)
- *H01L 33/60* (2010.01)

(52) U.S. Cl.
CPC ........... *H01L2224/73265* (2013.01); *H01L 2924/12041* (2013.01); *H01L 2924/15787* (2013.01)

(56) References Cited

U.S. PATENT DOCUMENTS

| | | | | |
|---|---|---|---|---|
| 8,450,861 | B2 * | 5/2013 | Otremba | H01L 23/3142 257/790 |
| 8,835,200 | B2 | 9/2014 | Zhong et al. | |
| 8,907,467 | B2 * | 12/2014 | Komposch | H01L 23/047 257/692 |
| 9,040,326 | B2 | 5/2015 | Zhong et al. | |
| 9,065,029 | B2 * | 6/2015 | Hirao | H01L 24/34 |
| 9,082,945 | B2 | 7/2015 | Fujimori et al. | |
| 2005/0023548 | A1 | 2/2005 | Bhat et al. | |
| 2008/0029906 | A1 * | 2/2008 | Otremba | H01L 23/3121 257/778 |
| 2009/0146170 | A1 | 6/2009 | Zhong et al. | |
| 2010/0102344 | A1 | 4/2010 | Ueji | |
| 2012/0104412 | A1 | 5/2012 | Zhong et al. | |
| 2012/0162984 | A1 | 6/2012 | Fujimori et al. | |
| 2014/0346542 | A1 | 11/2014 | Zhong et al. | |

FOREIGN PATENT DOCUMENTS

| | | |
|---|---|---|
| JP | 2007-294506 | 11/2007 |
| JP | 2011-505700 | 2/2011 |
| JP | 2011-151339 | 8/2011 |
| JP | 2012-060173 | 3/2012 |
| JP | 2012-142410 | 7/2012 |
| JP | 2012-253197 | 12/2012 |
| WO | 2008/105527 | 9/2008 |
| WO | 2009/070809 | 6/2009 |

* cited by examiner

LIGHT EMITTING MODULE

TECHNICAL FIELD

The present disclosure relates to a light emitting module including a light emitting element such as a light emitting diode (LED).

BACKGROUND ART

Semiconductor light emitting elements such as LEDs have a long life with high efficiency, so that they have widely been used as light sources for various apparatuses. For example, LEDs are used as illumination light sources in lamps, lighting apparatuses, and the like, or used as backlight light sources in liquid crystal display apparatuses.

LEDs are typically provided in various apparatuses by being unitized or packaged as an LED module. Specifically, the LED module includes a substrate and one or more LEDs placed on the substrate.

For this type of the LED module, PTL 1, for example, discloses a flip chip device including a substrate, a submount mounted on the substrate, and an LED mounted on the submount by flip-chip mounting.

CITATION LIST

Patent Literature

[PTL1]
Japanese unexamined patent application publication No. 2012-60173

SUMMARY OF INVENTION

Technical Problem

In recent years, there is a demand for blighter lighting apparatuses, and LED modules having higher wattage are required. In such a case, the number of LEDs in a LED module may be increased.

Here, LEDs generate heat due to emission of light. The heat increases the temperature of the LED, causing luminous efficiency to decrease. This also decreases reliability of the LED. Accordingly, increasing the number of the LEDs also increases heat quantity, causing the luminous efficiency and the reliability of the LEDs to decrease.

In view of the above, the size of a substrate on which the LED is mounted may be increased, so as to broaden the space between adjacent LED elements. This improves heat radiation properties of the LED. Accordingly, the increase in the LED temperature can be suppressed, even if a total heat quantity increases due to the increase in the number of the LEDs.

However, the space for the LED module inside the apparatus is limited, as exemplified by a narrow-angle light distribution apparatus, and so on. There is a limit to how much the size of the substrate can be increased in an apparatus. In contrast, downsizing in the LED module is required. In some cases, a wattage more than or equal to a conventional wattage may be required with smaller substrate size.

The present disclosure has been made in view of the above, and intends to provide a light emitting module with high reliability, which can be downsized and has excellent heat radiation properties.

Solution to Problem

In view of the above, an aspect of a light emitting module according to the present disclosure includes: a first substrate including a resin having insulation properties, and a copper component embedded in the resin; a second substrate above the copper component, the second substrate being soldered to the copper component; a mounting electrode above the second substrate; and a light emitting element above the mounting electrode, the light emitting element being gold-tin soldered to the mounting electrode.

According to an aspect of the light emitting module of the present disclosure, the light emitting element may include an element electrode joined to the mounting electrode, and the mounting electrode may have an external shape substantially identical to an external shape of the element electrode.

According to an aspect of the light emitting module of the present disclosure, the second substrate has a main surface close to the first substrate, and a whole of the main surface may be soldered to the copper.

According to an aspect of the light emitting module of the present disclosure, an aluminum film may be formed above the second substrate; the aluminum film may be (i) a reflection film that reflects light emitted from the light emitting element, and (ii) a wiring through which a current for causing the light emitting element to emit light; and the mounting electrode may be formed above the aluminum film in contact with the aluminum film.

According to an aspect of the present disclosure, the light emitting module may include a gold-tin layer on the mounting electrode, the gold-tin layer being formed when the light emitting element is gold-tin soldered to the mounting electrode, in which the aluminum film may be formed above the second substrate; the mounting electrode may be formed above the aluminum film; and the mounting electrode may include one of multiple layers and a single layer which include one of (i) at least one metal material selected from the group consisting of nickel, palladium, gold, titanium, white gold, and copper, and (ii) an alloy layer including the at least one metal material.

According to an aspect of the light emitting module of the present disclosure, a protection film may be formed above the aluminum film.

According to an aspect of the light emitting module of the present disclosure, the protection film may be formed in an area other than an area in which the mounting electrode is formed.

According to an aspect of the light emitting module of the present disclosure, the protection film may be a silicon dioxide film.

According to an aspect of the light emitting module of the present disclosure, the first substrate may be covered with a resist having reflectivity.

According to an aspect of the light emitting module of the present disclosure, the resist may be formed to have an opening in which the second substrate is placed.

According to an aspect of the light emitting module of the present disclosure, the first substrate includes a first conductive portion and the second substrate includes a second conductive portion, and the first conductive portion and the second conductive portion may be connected through a wire made of aluminum.

According to an aspect of the light emitting module of the present disclosure, when the copper component soldered to the second substrate is a first copper component, the first substrate may further include a second copper component that is embedded in the resin; the first copper component may be a copper plate that electrically floats; and the second copper component may be a copper wiring through which the current for causing the light emitting element to emit light.

According to an aspect of the light emitting module of the present disclosure, the second substrate may be a silicon substrate.

Advantageous Effects of Invention

According to the present disclosure, an LED module with high reliability, which can be downsized and has excellent heat radiation properties, can be achieved.

DESCRIPTION OF EMBODIMENTS

Figure 1:
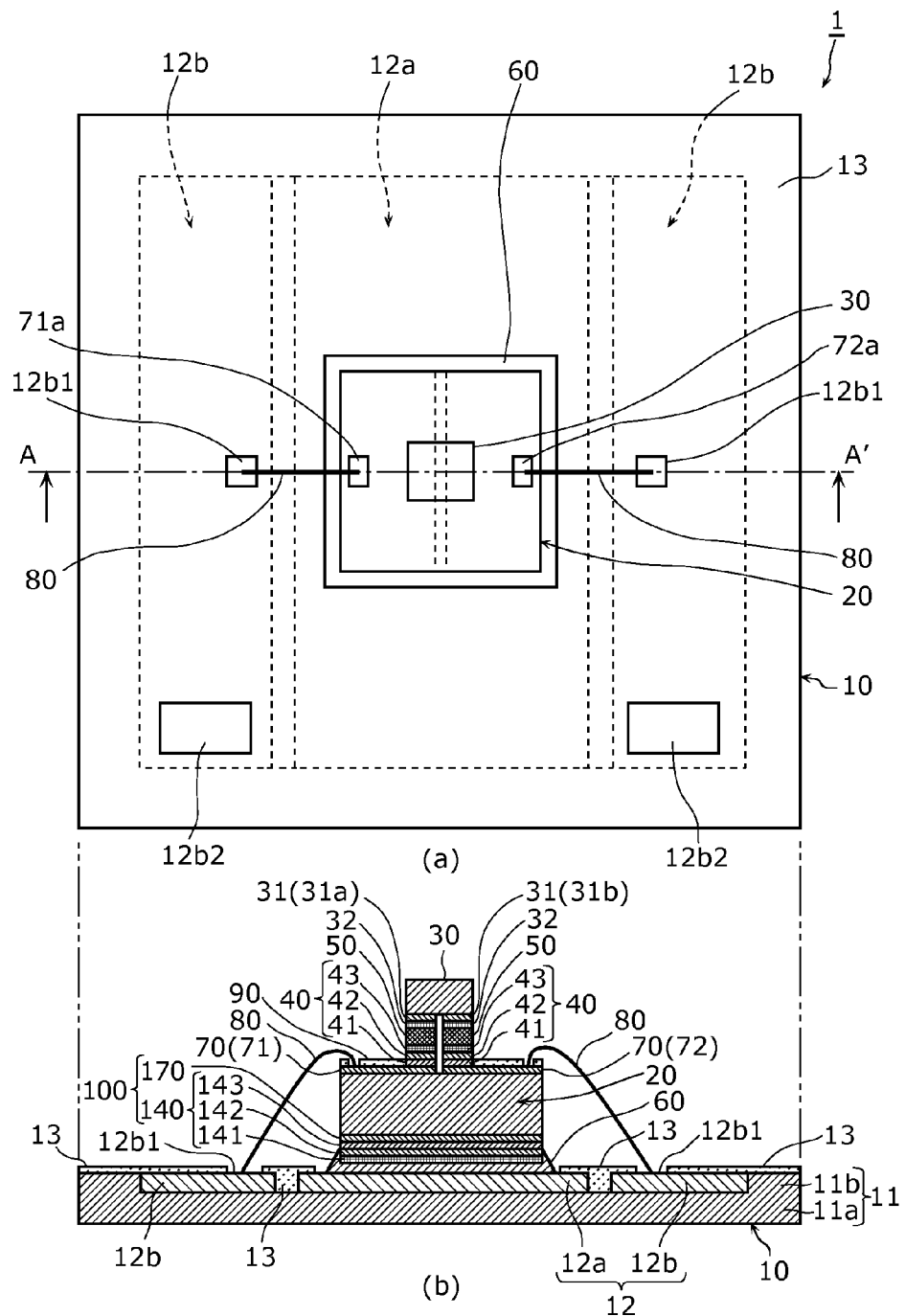
FIG. 1 includes (a) and (b), and (a) is a plan view showing an LED module according to an embodiment of the present disclosure, whereas (b) is a cross sectional view of the LED module taken along a line A-A' in (a).

An embodiment of the present disclosure will be described hereinafter, with reference to drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Each of the drawings is a schematic diagram, and does not necessarily show a configuration strictly. In the drawings, the substantially same configurations are provided with the same reference signs and redundant description is omitted or simplified.

Embodiment

In an embodiment below, an LED module is described as an example of a light emitting module (light emitting device).

A configuration of an LED module 1 according to the embodiment of the present disclosure is described with reference to FIG. 1. FIG. 1 includes (a) and (b), and (a) is a plan view showing an LED module according to the embodiment of the present disclosure, whereas (b) is a cross sectional view showing the LED module taken along a line A-A' in (a).

As shown in (a) and (b) of FIG. 1, the LED module 1 according to the present embodiment includes a first substrate 10, a second substrate 20 placed above the first substrate 10, and an LED 30 mounted above the second substrate 20.

A pair of mounting electrodes 40 are formed above the second substrate 20. The LED 30 is joined to the pair of mounting electrodes 40 with gold-tin soldering (AuSn soldering). Between the LED 30 and the mounting electrodes 40, a gold-tin layer (AuSn layer) 50 is formed. For the AuSn layer 50, an AuSn solder can be used, for example.

The first substrate 10 and the second substrate 20 are soldered. Between the first substrate 10 and the second substrate 20, a solder layer 60 is formed. For a solder material of the solder layer 60, a material may be used which has a melting point lower than that of the AuSn solder in the AuSn layer 50. For example, an Sn—Ag based solder may be used. This allows the second substrate 20, to which the LED 30 is AuSn-soldered, to be soldered to the first substrate 10. Specifically, after the LED 30 is AuSn-soldered to the second substrate 20, the first substrate 10 and the second substrate 20 can be soldered. Even in such a case, the AuSn layer 50 is never melted again. This prevents the LED 30 from being positionally displaced due to remelting that may occur in the AuSn layer 50.

For a solder material of the solder layer 60, a general purpose solder material including an Sn based solder, an In based solder, and so on may be used, which are used for typical soldering in electric components.

Hereinafter, structural components and connections in the structural components in the LED module 1 are described in detail.

The first substrate 10 is formed in such a manner that a copper component is embedded in an insulation resin. As described later, the first substrate 10 in the present embodiment works as a wiring substrate (circuit board) that electrically connects mounted electronic components, and also works as a heat radiation substrate (heat sink) that urges heat generated in the mounted electronic components to be released. Although the first substrate 10 in the present embodiment is shaped in a rectangle, other shapes including a circle, a polygon, or the like other than the rectangle may be used for the substrate.

The first substrate 10 includes a base resin 11 made of a resin material and a thin-plate copper plate 12 made of a copper material. For the resin material included in the base resin 11, a heat-conductive resin composition including a heat-conductive filler and a binder resin may be used, for example.

In such a case above, the heat-conductive filler having a heat conductivity greater than or equal to 2 W/m·K may be used. For the heat-conductive filler, a plurality of inorganic fillers each having individual Mohs' hardness may be used. For example, a hard filler having the Mohs' hardness 5 or more and a soft filler having the Mohs' hardness of 3 or less may be mixed and used for the heat-conductive filler. It should be noted that the Mohs' hardness indicates susceptiveness to a scratch upon being scratched, and can be expressed as the Mohs' hardness scales with 10 steps (former Mohs' hardness scale).

Specific examples for the hard filler having Mohs' hardness of 5 or more include, for example, aluminum oxide (Mohs' hardness: 9), magnesium oxide (Mohs' hardness: 6), fused silica (Mohs' hardness: 7), crystalline silica (Mohs' hardness: 7), aluminum nitride (Mohs' hardness: 7), silicon nitride (Mohs' hardness: 9), silicon carbide (Mohs' hardness: 9), and zinc oxide (Mohs' hardness: 4 to 5).

Specific examples for the soft filler having the Mohs' hardness of 3 or less include, for example, diatomaceous earth (Mohs' hardness: 1 to 1.5), boron nitride (Mohs' hardness: 2), aluminum hydroxide (Mohs' hardness: 2.5), magnesium hydroxide (Mohs' hardness: 2.5), calcium carbonate (Mohs' hardness: 3), talc (Mohs' hardness: 1), kaolin (Mohs' hardness: 1 to 2), clay (Mohs' hardness: 2.5 to 3), and mica (Mohs' hardness: 2.5 to 3).

For the binder resin, a thermosetting resin or a thermoplastic resin, and combination thereof may be used. The thermosetting resin should be used, since it can fill the heat-conductive filler with high density, and thus can achieve high improvement effect in the heat conductivity.

For the thermal setting resin, an unsaturated polyester resin, epoxy-based acrylate resin, epoxy resin, or the like should be used, since they are excellent in moldability and mechanical strength. For the thermoplastic resin, polyolefin-based resin, polyamide-based resin, elastomer-based resin, acrylic-based resin, polyester-based resin, an engineering plastic, or the like can be used.

In the heat-conductive resin composition, the binder resin may include the heat-conductive filler (hard filler and soft filler) of 50% by volume or more and less than 95% by volume. If content of the heat-conductive filler is less than 50% by volume, an improvement effect in the heat conductivity of the heat-conductive resin composition may not be obtained. The improvement effect is achieved by combining the heat-conductive filler. On the other hand, if the content of the heat-conductive filler is 95% by volume or more, viscosity of the heat-conductive resin composition is extremely high. This may cause the moldability of the heat-conductive resin composition to drastically deteriorate.

A ratio between the hard filler and the soft filler in the binder resin should be the hard filler/the soft filler=95/5 to 50/50. The ratio between the hard filler and the soft filler may be out of this range. If the ratio of the soft filler is smaller than that in the above range, fillers that cause particle deformation are insufficient, reducing contact areas in particles which are in contact with each other. This may fail to obtain enough improvement effect in the heat-conductivity. In contrast, the ratio of the soft filler may increase and be out of the above range. In such a case, the soft filler is not sufficiently deformed by the hard filler. This may also fail to obtain the enough improvement effect in the heat-conductivity. The heat-conductive resin composition having high heat conductivity can be obtained by including the hard filler and the soft filler at the ratio in the above range.

The heat-conductive resin composition obtained as above is molded by pressing to fix its shape. For the occasion, the soft filler is pressed by the hard filler, and a surface of the soft filler is deformed by the hard filler to allow the soft filler and the hard filler to be in surface contact with each other. Accordingly, the base resin 11 having high heat conductivity can be obtained, achieving the first substrate 10 with excellent heat radiativity.

The resin material of the base resin 11 is not limited to the aforementioned heat-conductive resin composition, and other resin composition may be used. In such a case, a resin material that does not include the heat-conductive filler may be used.

The base resin 11 is formed to accommodate the copper plate 12. The base resin 11 includes a plate base portion 11a serving as a bottom of the first substrate 10, and a ring-shaped wall portion 11b protruding from the base portion 11a in a vertical direction to a main surface of the first substrate 10. The wall portion 11b is formed to enclose an area (copper plate formed area) where the copper plate 12 is formed. The wall portion 11b in the present embodiment is provided in a rectangular-shaped loop (picture frame shape) in plan view.

The copper plate 12 is embedded in the base resin 11 in such a manner to expose a copper surface. In the present embodiment, the copper plate 12 undergoes pattern formation so as to form a plurality of copper plates including a first copper plate (first copper plate) 12a and second copper plates (second copper plates) 12b. Specifically, the first copper plate 12a and the second copper plates 12b are formed by implementing patterning on a single copper plate.

The second substrate 20 is placed above the first copper plate 12a. The first copper plate 12a and the second substrate 20 are soldered to each other. The first copper plate 12a mainly functions as the heat sink (heat radiation member), and thus may have a certain thickness or more. For example, the thickness of the first copper plate 12a is set to 150 µm or more, thereby securing enough heat radiation properties for the first substrate 10. In the present embodiment, the thickness of the first copper plate 12a is set to 175 µm.

In the present embodiment, the first copper plate 12a floats in an electrical sense. Accordingly, no current that causes the LED 30 to emit light flows in the first copper plate 12a. In other words, the first copper plate 12a electrically floats at least relative to potential of element electrodes 31 of the LED 30 (p-side electrode 31a, and n-side electrode 31b).

An area of the first copper plate 12a in plan view is larger than an area of the second substrate 20 in plan view. Specifically, the first copper plate 12a is formed to protrude from the second substrate 20, when the first substrate 10 is viewed in plan.

The first copper plate 12a and the second substrate 20 are thus soldered using a solder that is a metal material having high heat conductivity. This allows heat resistance between the first copper plate 12a and the second substrate 20 to be less than that of a case when the first copper plate 12a and the second substrate 20 are joined using a resin adhesive. Accordingly, a heat transfer efficiency between the first substrate 10 and the second substrate 20 can be improved.

Each of the second copper plates 12b is separated away from the first copper plate 12a. Specifically, the second copper plates 12b and the first copper plate 12a are not connected with each other in an electrical manner and a physical manner. A gap is provided between the first copper plate 12a and each of the second copper plates 12b.

The second copper plates 12b in the present embodiment function as copper wirings through which the current for causing the LED 30 to emit light flows. The second copper plates 12b are patterned to two copper wirings including a high potential copper wiring and a low potential copper wiring. As described later, the resist 13 covers the surface of the first substrate 10, and is also embedded in the gap between the first copper plate 12a and each of the second copper plate 12b, in the present embodiment.

The second copper plates 12b are formed using the copper plate identical to that used for the first copper plate 12a. Accordingly, a plate thickness of each of the second copper plate 12b is identical to that of the first copper plate 12a.

On each of the second copper plates 12b, a pair of connection portions (substrate connection portion) 12b1 are individually placed as a bonding pad area for electrically connecting to the aluminum film 70 (a first wiring portion 71 and a second wiring portion 72) formed on a top surface of the second substrate 20. The pair of connection portions 12b1 and the aluminum film 70 (the first wiring portion 71 and the second wiring portion 72) are wire-bonded using a wire 80. The wire 80 is, for example, a metallic wire (Al wire) made of aluminum (Al). A conductive portion (connection portion 12*b*1) of the first substrate 10 and a conductive portion (the aluminum film 70) of the second substrate 20 are thus connected using the wire 80 made of aluminum, thereby reflecting light that falls on the wire 80. Accordingly, a light extraction efficiency of the LED module 1 can be increased.

The pair of connection portions 12*b*1 are provided by forming openings in the resist 13. At the connection portions 12*b*1, pad electrodes may newly be formed.

A pair of connection terminals (portions for connecting a member for receiving external power supply) 12*b*2 are individually provided on each of the second copper plates 12*b* for electrically connecting to a member for receiving electricity externally supplied. The connection terminals 12*b*2 are external connection terminals for receiving a direct-current power from the outside of the LED module 1. Each of the pair of the connection terminals 12*b*2 may be formed in a socket shape, for example, and includes a resin socket and a conductive pin for receiving the direct-current power. The conductive pin is electrically connected to the second copper plate 12*b*.

Each of the connection terminals 12*b*2 is mounted by a connector wire, for example, so as to receive power supply via the connector wire. Each of the connection terminals 12*b*2 may include a socket into which a metal core wire of a lead for receiving the power supply is directly inserted. Alternatively, the connection terminal 12*b*2 may not be in the socket shape, but may be a metal electrode that exposes a metal surface, like the connection portion 12*b*1.

In the present embodiment, the first substrate 10 is covered by the resist 13. The resist 13 is an insulation film made of a resin material having reflectivity and insulation. For the resist 13, a white resist having high reflectivity can be used, for example.

The surface of the first substrate 10 is covered by the resist 13, to thereby reflect the light fallen on the first substrate 10. This improves the light extraction efficiency of the LED module 1.

A surface of the copper plate 12 is coated with the resist 13, to thereby restrain surface oxidation in the copper plate 12. The second copper plates 12*b* serving as wirings are covered by the resist 13 having the insulation properties, to thereby increase insulation properties (pressure resistant) of the first substrate 10.

In the present embodiment, the resist 13 is formed in such a manner to have openings at an area where the second substrate 20 is mounted, and areas for the connection portions 12*b*1 and the connection terminals 12*b*2 in the second copper plates 12*b*. The resist 13 is formed in an area except these areas. In other words, the resist 13 is formed over the first substrate 10 excluding areas that electrically connected to other members.

As described above, when the first substrate 10 is viewed in plan, a whole of the main surface of the first substrate 10 can be covered by the resist 13, to thereby maximize a light-reflection area by the resist 13. Accordingly, the light extraction efficiency of the LED module 1 can be further increased. When other electronic components are implemented in the first substrate 10, the resist 13 is formed to have openings at areas where the electronic components are implemented. In other words, the resist 13 is not formed in areas where electronic components are mounted.

The second substrate 20 is located between the first substrate 10 and the LED 30. The second substrate 20 in the present embodiment is a base substrate serving as an interposer (wiring relay substrate) for mounting the LED 30, and is mounted on the first substrate 10. Specifically, the second substrate 20 includes the wiring (relay wiring) for electrically conducting the wiring of the first substrate 10 (the second copper plates 12*b*) and the LED 30. The second substrate 20 also serves as a heat-radiation member for radiating the heat generated in the LED 30.

For the second substrate 20, a silicon substrate, a ceramic substrate, and so on may be used. The ceramic substrate is made of alumina ($Al_2O_3$), aluminum nitride (AlN), and so on. In the present embodiment, a rectangular silicon substrate is used as the second substrate 20.

On the top surface of the second substrate 20, the aluminum film (aluminum layer) 70 is formed. The aluminum film 70 is a reflection film that reflects the light emitted by the LED 30, and also serves as a wiring through which a current for causing the LED 30 to emit light flows.

The aluminum film 70 is divided in two parts including a first wiring portion 71 in a high potential side and a second wiring portion 72 in a low potential side. Almost the entire top surface of the second substrate 20 is covered by the first wiring portion 71 and the second wiring portion 72. This causes more light to be reflected, to thereby increase the light extraction efficiency of the LED module 1.

The first wiring portion 71 and the second wiring portion 72 respectively includes a connection portion 71*a* and a connection portion 72*a*, which serve as bonding pads for electrically connecting to the pair of connection portions 12*b*1 of the second copper plates 12*b* on the first substrate 10 through the wire 80.

On the aluminum film 70, a protection film 90 having optical transparency is formed. This suppresses decreasing the light reflectivity of the aluminum film 70 due to oxidation or sulfuration thereof.

The protection film 90 in the present embodiment is formed on the aluminum film 70 except areas where the mounting electrodes 40 are formed and areas for the connection portions 71*a* and 72*a*. This minimizes decreasing in the light reflectivity of the aluminum film 70 due to the oxidation and the sulfuration thereof. The connection portions 71*a* and 72*a* are provided by forming openings in the protection film 90.

For the protection film 90, a transparent protection film, such as a silicon dioxide film ($SiO_2$ film), for example, can be used. The transparent protection film, such as the $SiO_2$ film, has high optical transparency. Accordingly, the transparent protection film is used as the protection film 90, to thereby restrain the oxidation and the sulfuration of the aluminum film 70, with keeping the reflectivity thereof.

The mounting electrodes 40 are formed on a part of a surface of the aluminum film 70. Specifically, the mounting electrodes 40 are formed on the aluminum film 70 in a manner to be in contact with the aluminum film 70. In the present embodiment, one of the pair of the mounting electrodes 40 is formed on a surface of the first wiring portion 71, and another one of the mounting electrodes 40 is formed on a surface of the second wiring portion 72.

The mounting electrodes 40 serve as pad members (pad electrodes) used at a time when the LED 30 is AuSn-soldered to the second substrate 20. Each of the mounting electrodes 40 includes a single layer or multiple layers. The single layer or the multiple layers include one of (i) at least one metal material selected from the group consisting of nickel (Ni), palladium (Pd), gold (Au), titanium (Ti), white gold (Pt), and copper (Cu), and (ii) an alloy layer including the one metal material. Accordingly, the AuSn layer 50 having high reliability for joint is used to mount the LED 30 in the second substrate 20.

In the present embodiment, each of the mounting electrodes 40 includes a first metal layer 41 made of Ni, a second metal layer 42 made of Pd or Pt, and a third metal layer 43 made of Au in this order from the aluminum film 70 toward the AuSn layer 50 (along a direction from the second substrate 20 toward the LED 30). These metal layers can be formed using a spattering method, a vapor deposition method, or a plating method.

The AuSn layer 50 is formed on the mounting electrodes 40. In the present embodiment, the AuSn layer 50 is formed on a third metal layer 43. An AuSn layer (gold-tin layer) 50 is formed between the LED 30 and the mounting electrodes 40. In the present embodiment, an AuSn solder is used for the AuSn layer 50. The AuSn solder can be formed on the mounting electrodes 40 by the plating method, the vapor deposition method, or a paste method.

In each of the mounting electrodes 40, the second metal layer 42 works as a barrier layer. The first metal layer 41 is inserted between the aluminum film 70 and the second metal layer 42, to increase bondability of them. The third metal layer 43 is inserted between the second metal layer 42 and the AuSn layer 50, to increase bondability of them.

The second substrate 20 is soldered to the first copper plate 12a in the first substrate 10. The solder layer 60 is formed between the second substrate 20 and the first copper plate 12a. In the present embodiment, a pad member (pad electrode) 100 is formed on a bottom surface of the second substrate 20. The second substrate 20 is fixedly attached to the first substrate 10 by soldering the pad member 100 formed on the bottom surface of the second substrate 20 to the solder layer 60. The solder layer 60 is thus formed between the pad member 100 and the first substrate 10 (the first copper plate 12a).

The pad member 100 includes the same metal materials as those formed on the top surface of the second substrate 20. The pad member 100 includes a plurality of layers including, from the second substrate 20 toward the solder layer 60, an aluminum film 170 made of aluminum and a mounting electrode 140 including a first metal layer 141 made of Ni, a second metal layer 142 made of Pd or Pt, and a third metal layer 143 made of Au. These metal layers can be formed using the spattering method, the vapor deposition method, or the plating method.

The LED 30 is an example of light emitting elements, and emits light using a predetermined power. In the present embodiment, the LED 30 serves as a bare chip (an LED chip) that emits a monochromatic visible light by power distribution of the direct current. For the LED 30, an LED chip that emits ultraviolet light can be used, in addition to LED chips that emit light in visible wavelength bands, such as a blue LED chip that emits blue light, a red LED chip that emits red light, or a green LED chip that emits green light.

The LED 30 (LED chip) includes, for example, a plurality of nitride semiconductor layers stacked on a substrate and the element electrodes 31 formed on a top surface of the nitride semiconductor layers. The element electrodes 31 include a p-side electrode 31a and n-side electrode 31b.

The LED 30 is mounted on the second substrate 20 with flip chip mounting in such a manner that the element electrodes 31 face the second substrate 20. The element electrodes 31 of the LED 30 and the mounting electrodes 40 are individually soldered to each other with AuSn. The AuSn layer 50 is formed between each of the element electrodes 31 and the corresponding one of the mounting electrodes 40.

In the present embodiment, a gold layer (Au layer) 32 is formed between each of the element electrodes 31 and the AuSn layer 50. The gold layer 32 is provided to increase the bondability between the AuSn layer 50 and the element electrodes 31. The gold layer 32 can be formed using, for example, the sputtering method, the vapor deposition method, or the plating method.

No element electrodes 31 may be formed in the LED 30. In such a case, the gold layer 32 should be directly connected to a p-type semiconductor layer and a n-type semiconductor layer in the LED 30.

A sealing member (not shown) may be formed so as to cover the LED 30. The sealing member is, for example, a transparent resin or a phosphor-containing resin. The phosphor-containing resin may be used. For the occasion, a blue LED chip may be used as the LED 30 for causing the LED module 1 to emit white light, and a transparent silicon resin may be also used as a sealing member, for example. The transparent silicon resin contains yttrium aluminum garnet (YAG) based yellow phosphor particles. Accordingly, a wavelength of a part of the blue light emitted from the blue LED chip is converted to yellow light by the yellow phosphor particles contained in the sealing member. The remaining blue light which is not absorbed by the yellow phosphor particles and the yellow light obtained by the wavelength conversion by the yellow phosphor particles are mixed to be white light. The white light is emitted from the sealing member. For the blue LED chip, a gallium nitride based semiconductor light emitting element can be used that is made of an InGaN based material and has a center wavelength of 440 nm to 470 nm, for example.

As aforementioned, the LED module 1 according to the present embodiment can be formed.

Although a single LED 30 is mounted in the second substrate 20 in the present embodiment, a plurality of LEDs 30 may be mounted in the second substrate 20.

Figure 2:
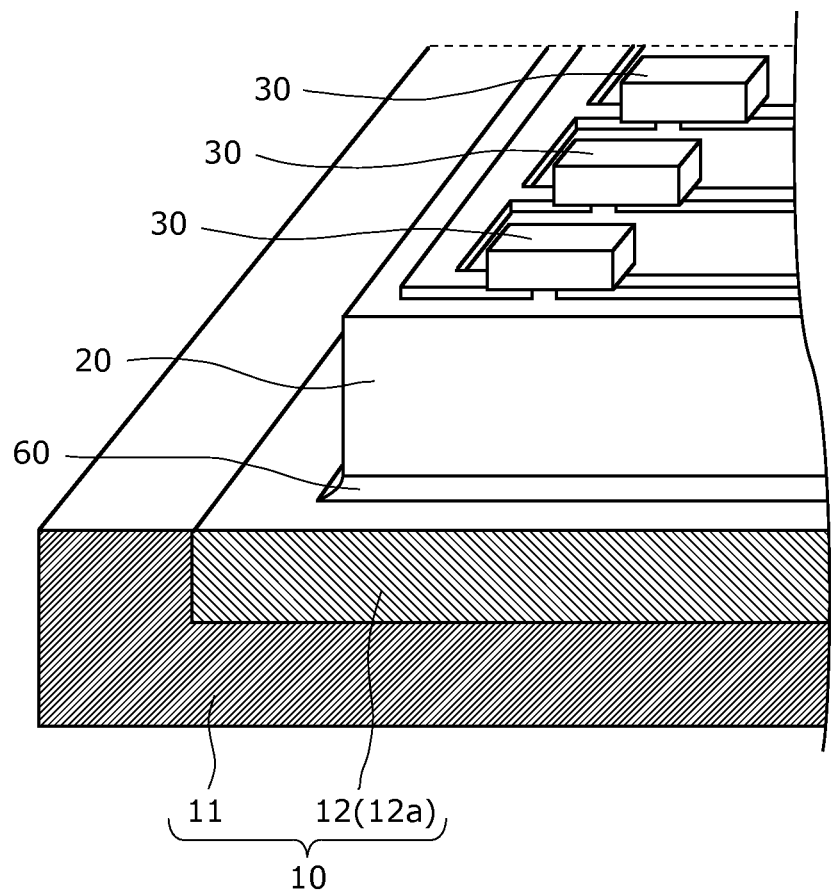
FIG. 2 is a perspective view showing a partially notched LED module according to the embodiment of the present disclosure.

As shown in FIG. 2, a plurality of LEDs 30 may be mounted on the second substrate 20 soldered with the first copper plate 12a on the first substrate 10, for example. This achieves the LED module including a plurality of LEDs 30.

According to the LED module 1 of the present embodiment, the LED 30 and the second substrate 20 are soldered with AuSn via the mounting electrodes 40, and the second substrate 20 and the first copper plate 12a on the first substrate 10 are soldered.

Accordingly, the LED 30 and the second substrate 20 can be joined by the AuSn layer 50 having high heat conductivity. In addition, the second substrate 20 and the first copper plate 12a on the first substrate 10 can be joined using the solder layer 60 having high heat conductivity. As a result, the heat generated in the LED 30 is efficiently conveyed to the first copper plate 12a in the first substrate 10 via the second substrate 20 and the metal layers on both surfaces (the AuSn layer 50, and the solder layer 60) of the second substrate 20, so as to be radiated two-dimensionally from the plate-shaped first copper plate 12a. This extracts the heat from the LED 30 efficiently, suppressing increase in the temperature of the LED 30.

As aforementioned, according to the LED module 1 of the present embodiment, high heat radiativity can be obtained. Even if a plurality of LEDs 30 are located on one of the surfaces of the second substrate 20 relatively densely, the increase in the temperature of each of the LEDs 30 can be sufficiently suppressed. Accordingly, the LED module 1 can be downsized, and the decease in the light emission efficiency due to increase in the heat generated by the plurality of LEDs 30 can be restrained. Further, the number of the LEDs 30 to be mounted can be increased without changing a substrate size, achieving a brighter LED module with high wattage (high luminous flux).

Consequently, the LED module that has high luminous flux and is capable of downsized can be achieved, with excellent heat radiativity and high reliability.

In the present embodiment, each of the mounting electrodes 40 has the substantially same external shape as those of the p-side electrode 31a and the n-side electrode 31b in the LED 30. Specifically, an entire side surface of each of the mounting electrodes 40 is flush with an entire side surface of the p-side electrode 31a (n-side electrode 31b). This maximizes heat-conductive path between the LED 30 and each of the mounting electrodes 40, to thereby minimize the heat resistance. Accordingly, the heat generated in the LED 30 can be efficiently conveyed to the second substrate 20, to thereby increase the heat radiativity of the LED module 1 still more.

In the present embodiment, as shown in (a) of FIG. 1, an area of the second substrate-side surface of the first copper plate 12a is larger than an area of a first substrate-side main surface of the second substrate 20. This means that the entire main surface of the second substrate 20, which is close to the first substrate, is soldered to the first copper plate 12a. This maximizes the heat-conductive path between the first substrate (the first copper plate 12a) and the second substrate 20, so as to minimize heat resistance. Accordingly, the heat that is generated in the LED 30 and conveyed to the second substrate 20 is efficiently conveyed to the first substrate 10, thereby increasing the heat radiativity of the LED module 1 still more.

In the present embodiment, the aluminum film 70 serves as a light reflection film, a wiring, and a connection portion (bonding pad portion), thereby allowing an area of the aluminum film 70 to be maximized. This increases the heat extraction efficiency of LED module 1.

Figure 3:
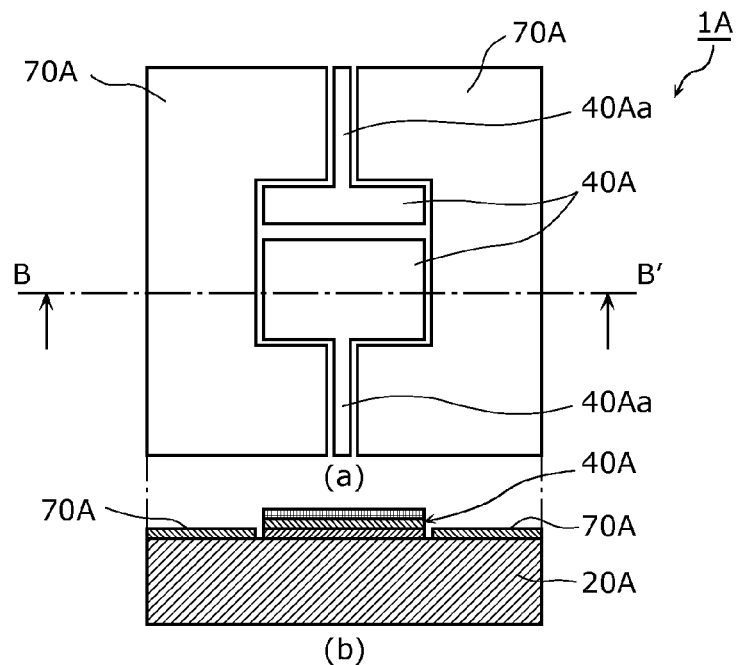
FIG. 3 includes (a) and (b), and (a) is a diagram showing relation between an aluminum film and a mounting electrode in an LED module according to a comparative example, whereas (b) is a cross sectional view taken along a line B-B' in (a).
Figure 4:
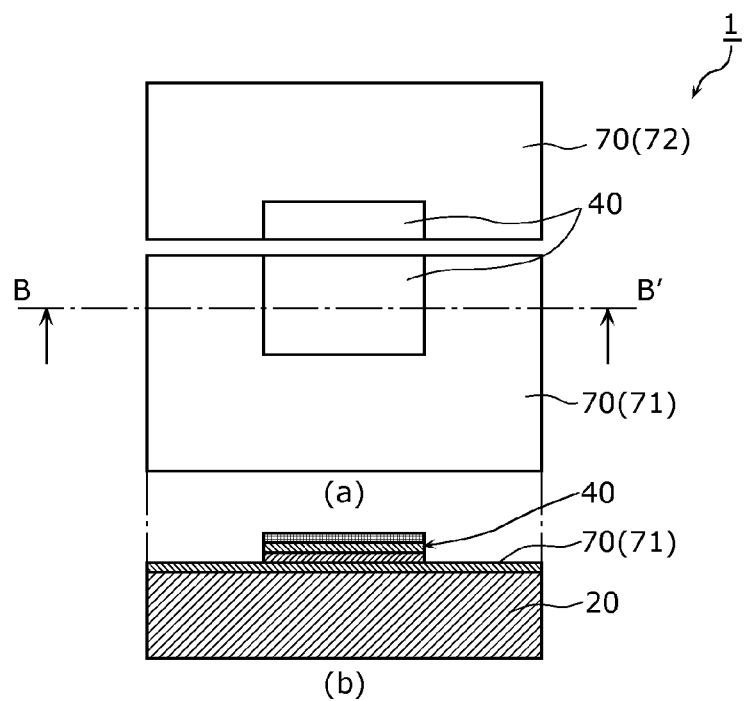
FIG. 4 includes (a) and (b), and (a) is a diagram showing relation between an aluminum film and a mounting electrode in the LED module according to the embodiment of the present disclosure, whereas (b) is a cross sectional view taken along a line B-B' in (a).

This point is described with reference to FIG. 3 and FIG. 4. FIG. 3 is a diagram showing configurations of a second substrate, an aluminum film, and a mounting electrode in an LED module according to a comparative example. FIG. 3 includes (a) and (b), in which (a) is a plan view and (b) is a cross sectional view taken along a line B-B' in (a). FIG. 4 is a diagram showing configurations of the second substrate, the aluminum film, and the mounting electrode of the LED module according to the embodiment of the present disclosure. FIG. 4 includes (a) which is a plan view and (b) which is a cross sectional view taken along a line B-B' in (a). It should be noted that (a) of FIG. 4 shows a condition obtained by rotating the diagram (a) of FIG. 1 at 90 degrees.

As shown in (a) and (b) of FIG. 3, an LED module 1A of the comparative example includes an aluminum film 70A and a pair of mounting electrodes 40A soldered to an LED. The aluminum film 70A and each of the pair of the mounting electrodes 40A are formed separately from each other on the same surface of a second substrate 20A. Specifically, each of the mounting electrodes 40A is connected to a corresponding one of extraction electrodes 40Aa. The aluminum film 70A is patterned in a shape that excludes areas for the pair of mounting electrodes 40A and the extraction electrodes 40Aa.

On the other hand, in the LED module 1 according to the present embodiment, the pair of the mounting electrodes 40 are formed on the aluminum film 70 (the first wiring portion 71, the second wiring portion 72), as described above and shown in (a) and (b) of FIG. 4. The aluminum film 70 is thus used as the wiring and the connection portion (the bonding pad portion), in addition to the light reflection film.

This allows the aluminum film 70 according to the present embodiment ((a) of FIG. 4) to have a larger area, in plan view, than the aluminum film 70A according to the comparative example ((a) of FIG. 3) has. This means that the reflection area of the aluminum film can be enlarged. Accordingly, the light extraction efficiency of the LED module can be increased.

Figure 5:
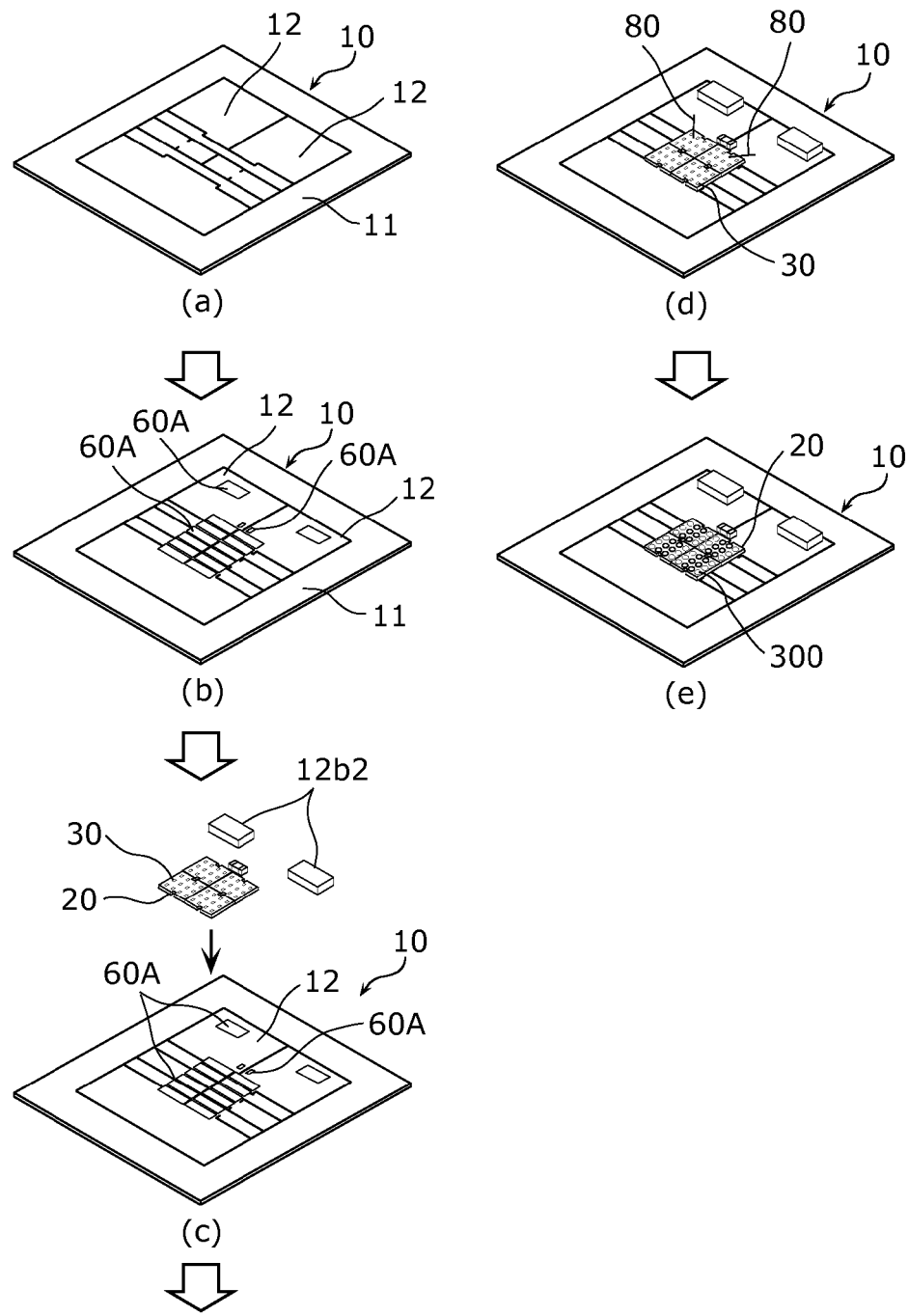
FIG. 5 includes (a) to (e) which are diagrams for describing steps in a method for manufacturing the LED module according to the embodiment of the present disclosure.
Figure 6:
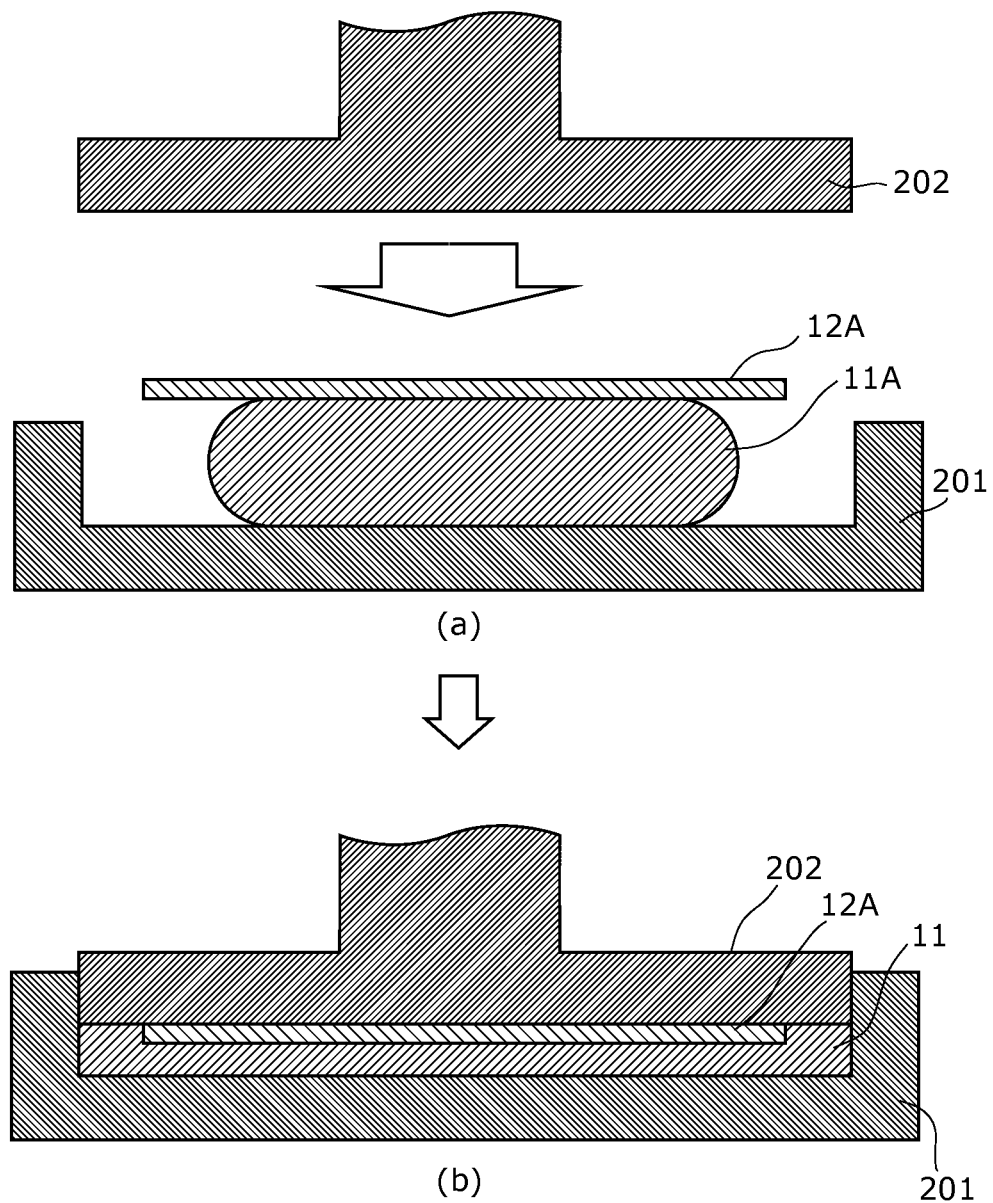
FIG. 6 includes (a) and (b) and is a diagram for describing a method for fabricating a first substrate in the LED module according to the embodiment of the present disclosure.

A method for manufacturing the LED module according to the embodiment of the present disclosure is now described with reference to FIG. 5 and FIG. 6. FIG. 5 is a diagram for describing the method for manufacturing the LED module according to the embodiment of the present disclosure. FIG. 5 illustrates a method for manufacturing the LED module including a plurality of LEDs 30 mounted on the second substrate 20. FIG. 6 is a diagram for describing a method for fabricating the first substrate in the method for manufacturing the LED module according to the embodiment of the present disclosure.

As shown in (a) of FIG. 5, the first substrate 10 is fabricated in which copper components are embedded in a resin having a predetermined shape.

Specifically, as shown in (a) of FIG. 6, a pasty resin mass 11A made of a predetermined resin material is placed in a predetermined metal mold 201 having the same external shape as that of the first substrate 10 to be fabricated, and a copper plate 12A is placed on the resin mass 11A. For the resin mass 11A and the base resin 11, the aforementioned heat-conductive resin composition can be used. For example, the heat-conductive resin composition including a heat-conductive filler and a binder resin. The heat-conductive filler includes the hard filler with the Mohs' hardness of 5 or more, and the soft filler with the Mohs' hardness of 3 or less.

Subsequently, a plate compression device 202 is, for example, used to apply pressure onto a surface of the copper plate 12A so as to pressingly flatten the resin mass 11A. The resin mess 11A is thus pressed out in flat, so as to be a thin film. Accordingly, the resin mass 11A is shaped in a plate, and an external shape of the resin mass 11A can be shaped along a shape of the metal mold 201. The base resin 11 can be thus formed with the surface of the copper plate 12A being exposed and the copper plate 12A being embedded in the resin material. When the resin mass 11A is pressed, heat may be applied.

The resin material in which the copper plate 12A is embedded is then hardened. For the occasion, the resin material may be heated to be hardened.

The copper plate then undergoes patterning by etching, for example, to divide the copper plate into a plurality of copper plates.

Accordingly, as shown in (a) of FIG. 5, the first substrate 10 including the base resin 11 in which the plurality of copper plates 12 are embedded can be fabricated.

Subsequently, as shown in (b) of FIG. 5, a solder 60A is formed on a predetermined portion on the copper plate 12 of the first substrate 10, in order to solder mounting components to the first substrate 10. In the present embodiment, the second substrate 20 including the LED 30, the connection terminals (connectors) 12b2, and an electrostatic protection element (zener diode) are mounted on the first substrate 10. Accordingly, solders are printed on portions on the first substrate 10, where these mounting components are to be mounted.

Subsequently, as shown in (c) of FIG. 5, the second substrate 20 including the LED 30, the connection terminals (connectors) 12b2, and the electrostatic protection element are mounted on portions of the first substrate 10, where the solders are printed. The second substrate 20 and the first substrate 10 are then soldered by reflow.

Subsequently, as shown in (d) of FIG. 5, the wire 80 is used for wire bonding. Specifically, a bonding pad portion in the first substrate 10 and a bonding pad portion (not shown) in the aluminum film 70 are wire-bonded.

Subsequently, as shown in (e) of FIG. 5, a sealing member 300 is coated on the LED 30 to seal the LED 30, depending on needs. For example, the seal member 300 is potted to each of the plurality of the LED 30.

Accordingly, the LED module including the second substrate (interposer) 20 in which the plurality of LEDs 30 are mounted can be fabricated.

As aforementioned, the LED module according to the present disclosure is described with reference to the embodiment. Here, the present disclosure is not limited to the above embodiment.

For example, although the LED is exemplified as a light emitting element in the above embodiment, other solid light emitting elements including a semiconductor light emitting element such as a semiconductor laser and the like, or an electro luminescence (EL) element such as an organic EL or an inorganic EL, may be used as the light emitting element.

Forms obtained by various modifications to the exemplary embodiments that can be conceived by a person of skill in the art as well as forms realized by combining structural components in different exemplary embodiments, which are within the scope of the essence of the present disclosure may be included in one or more aspects.

1, 1A: LED module (light emitting module)
10: First substrate
11: Base resin
11A: Resin mass
11a: Plate base portion
11b: Wall portion
12: Copper plate
12A: Copper plate
12a: First copper plate
12b: Second copper plate
12b1, 71a, 72a: Connection portion
12b2: Connection terminal
13: Resist
20, 20A: Second substrate
30: Light emitting diode (LED)
31: Element electrode
31a: P-side electrode
31b: N-side electrode
32: Gold layer
40, 40A, 140: Mounting electrode
40Aa: Extraction electrode
41, 141: First metal layer
42, 142: Second metal layer
43, 143: Third metal layer
50: AuSn layer
60: Solder layer
60A: Solder
70, 70A, 170: Aluminum film
71: First wiring portion
72: Second wiring portion
80: Wire
90: Protection film
100: Pad member
201: Metal mold
202: Plate compression device
300: Sealing member

The invention claimed is:

1. A light emitting module comprising:
a first substrate including a resin having insulation properties, and a copper component embedded in the resin;
a second substrate above the copper component, the second substrate being soldered to the copper component;
a mounting electrode above the second substrate; and
a light emitting element above the mounting electrode, the light emitting element being gold-tin soldered to the mounting electrode,
wherein an aluminum film is formed above the second substrate;
the aluminum film is (i) a reflection film that reflects light emitted from the light emitting element, and (ii) a wiring through which a current for causing the light emitting element to emit light; and
the mounting electrode is formed above the aluminum film in contact with the aluminum film.

2. The light emitting module according to claim 1,
wherein the light emitting element includes an element electrode joined to the mounting electrode, and
the mounting electrode has an external shape substantially identical to an external shape of the element electrode.

3. The light emitting module according to claim 1,
wherein the second substrate has a main surface close to the first substrate, and a whole of the main surface is soldered to the copper.

4. The light emitting module according to claim 1, further comprising
a gold-tin layer on the mounting electrode, the gold-tin layer being formed when the light emitting element is gold-tin soldered to the mounting electrode,
wherein
the mounting electrode includes one of multiple layers and a single layer which include one of (i) at least one metal material selected from the group consisting of nickel, palladium, gold, titanium, white gold, and copper, and (ii) an alloy layer including the at least one metal material.

5. The light emitting module according to claim 1,
wherein a protection film is formed above the aluminum film.

6. The light emitting module according to claim 5,
wherein the protection film is formed in an area other than an area in which the mounting electrode is formed.

7. The light emitting module according to claim 5,
wherein the protection film is a silicon dioxide film.

8. The light emitting module according to claim 1,
wherein the first substrate is covered with a resist having reflectivity.

9. The light emitting module according to claim 8,
wherein the resist is formed to have an opening in which the second substrate is placed.

10. The light emitting module according to claim 1,
wherein the first substrate includes a first conductive portion and the second substrate includes a second conductive portion, the first conductive portion and the second conductive portion being connected through a wire made of aluminum.

11. The light emitting module according to claim 1,
wherein when the copper component soldered to the second substrate is a first copper component, the first substrate further includes a second copper component that is embedded in the resin;
the first copper component is a copper plate that electrically floats; and
the second copper component is a copper wiring through which the current for causing the light emitting element to emit light.

12. The light emitting module according to claim 1,
wherein the second substrate is a silicon substrate.

* * * * *